(12) United States Patent
Gaal

(10) Patent No.: US 9,554,200 B2
(45) Date of Patent: Jan. 24, 2017

(54) ELECTRONIC SHELF ASSEMBLY INCORPORATING SPRING LOADED CIRCUIT PACK LATCH RAILS

(71) Applicant: Adrianus Van Gaal, Ottawa (CA)

(72) Inventor: Adrianus Van Gaal, Ottawa (CA)

(73) Assignee: Ciena Corporation, Hanover, MD (US)

( * ) Notice: Subject to any disclaimer, the term of this patent is extended or adjusted under 35 U.S.C. 154(b) by 76 days.

(21) Appl. No.: 14/510,228

(22) Filed: Oct. 9, 2014

(65) Prior Publication Data

US 2016/0105990 A1 Apr. 14, 2016

(51) Int. Cl.
*H04Q 1/14* (2006.01)
*H05K 7/14* (2006.01)
*H05K 7/18* (2006.01)
*H04Q 1/02* (2006.01)

(52) U.S. Cl.
CPC ............... *H04Q 1/14* (2013.01); *H04Q 1/021* (2013.01); *H05K 7/1417* (2013.01); *H05K 7/183* (2013.01)

(58) Field of Classification Search
CPC ........ H05K 7/183; H05K 7/1417; H04Q 1/14; H04Q 1/021
See application file for complete search history.

(56) References Cited

U.S. PATENT DOCUMENTS

| | | | | |
|---|---|---|---|---|
| 3,743,150 A | * | 7/1973 | Eckart, Jr. ........... | B05B 15/0456 225/47 |
| 3,744,560 A | * | 7/1973 | Sell, Jr. ................... | H01L 35/06 165/185 |
| 3,777,675 A | * | 12/1973 | Hanusiak ............. | A47B 3/0912 108/132 |
| 5,291,368 A | * | 3/1994 | Conroy-Wass ........ | H05K 7/183 361/690 |
| 5,450,272 A | | 9/1995 | Van Gaal et al. | |
| 5,675,475 A | | 10/1997 | Mazura et al. | |
| 6,166,919 A | | 12/2000 | Nicolici et al. | |
| 6,246,585 B1 | | 6/2001 | Gunther et al. | |
| D486,454 S | | 2/2004 | Vink-Ellis et al. | |
| 6,955,550 B2 | | 10/2005 | Schlack | |
| 8,441,802 B2 | * | 5/2013 | Colongo .............. | H05K 7/1409 361/754 |
| 2013/0070421 A1 | * | 3/2013 | Zhou ....................... | G06F 1/186 361/724 |

FOREIGN PATENT DOCUMENTS

CA 1237821 A1 6/1986

\* cited by examiner

*Primary Examiner* — Stanton L Krycinski
(74) *Attorney, Agent, or Firm* — Clements Bernard PLLC; Christopher L. Bernard; Lawrence A. Baratta, Jr.

(57) ABSTRACT

An electronic shelf assembly configured to selectively receive a circuit pack including a pivotable handle incorporating a retention hook, the electronic shelf assembly including: a shelf assembly housing configured to selectively receive the circuit pack; a support rail coupled to the shelf assembly housing; a latch rail member movably coupled to the support rail and defining a recess configured to selectively receive and retain the retention hook of the pivotable handle of the circuit pack, thereby selectively securing the circuit pack within the shelf assembly housing; and a spring mechanism coupled to the latch rail member and the support rail, wherein the spring mechanism allows for relative movement of the latch rail member with respect to the support rail while biasing the latch rail member towards the support rail, thereby selectively biasing the circuit pack into the shelf assembly housing.

20 Claims, 5 Drawing Sheets

ELECTRONIC SHELF ASSEMBLY INCORPORATING SPRING LOADED CIRCUIT PACK LATCH RAILS

FIELD OF THE DISCLOSURE

The present disclosure relates generally to an electronic shelf assembly, such as that used in the optical networking field and others. More specifically, the present disclosure relates to an electronic shelf assembly incorporating spring loaded circuit pack latch rails.

BACKGROUND OF THE DISCLOSURE

In the optical networking field and others, electronic components, or electronic circuit packs or cards, are typically inserted into an electronic shelf assembly, or electronic chassis or rack, including a backplane by which electrical connections are made. Typically, these electronic circuit packs or cards are inserted into the electronic shelf assembly in a side-by-side vertical (or horizontal) configuration, and each circuit pack or card is secured within the shelf assembly by one or more latches that engage latch rails coupled to the shelf assembly. When inserted, connectors on the back portion of each circuit pack engage connectors on the backplane, completing the desired electrical connections. In high speed optical networking systems, for example, it is desirable that these connectors are fully engaged (i.e., "fully seated" or "bottomed out"), given a range of manufacturing and assembly tolerances associated with the various mechanical structural components. Thus, the connectors must have sufficient "wipe" and be able to accommodate this range of manufacturing and assembly tolerances.

As optical networking system speeds continue to increase, connectors (and the associated pins) are becoming shorter and shorter, to improve signal integrity, and connector "wipe" is decreasing, resulting in tighter and tighter manufacturing and assembly tolerances. This translates into increased expense, as conventional manufacturing technologies must be abandoned. Conventional electronic shelf assemblies, circuit packs, and latches do not adequately address this issue.

Thus, what is still needed in the art is an electronic shelf assembly that minimizes the issue of connector mating tolerance; consistently "seating" and "bottoming out" shortened connectors, while allowing a circuit pack to be properly secured by conventional latch(es) and accommodating a range of manufacturing and assembly tolerances.

BRIEF SUMMARY OF THE DISCLOSURE

In various exemplary embodiments, the present disclosure provides an electronic shelf assembly that incorporates spring loaded circuit pack latch rails. The spring mechanism utilized with each latch rail is pre-loaded in excess of the given connector insertion force and the connector will "bottom out" before the spring mechanism is compressed further. Once the connector is "bottomed out," the latch force will exceed the pre-load on the spring mechanism, and the latch rail will move or deflect. This movement or deflection of the latch rail absorbs the manufacturing and assembly tolerances associated with the electronic shelf assembly, circuit pack, and latches, while properly securing the circuit pack in the electronics shelf assembly. In this manner, excess forces on the connectors are avoided.

In one exemplary embodiment, the present disclosure provides an electronic shelf assembly configured to selectively receive a circuit pack including a pivotable handle incorporating a retention hook, the electronic shelf assembly including: a shelf assembly housing configured to selectively receive the circuit pack; a support rail coupled to the shelf assembly housing; a latch rail member movably coupled to the support rail and defining a recess configured to selectively receive and retain the retention hook of the pivotable handle of the circuit pack, thereby selectively securing the circuit pack within the shelf assembly housing; and a spring mechanism coupled to the latch rail member and the support rail, wherein the spring mechanism allows for relative movement of the latch rail member with respect to the support rail while biasing the latch rail member towards the support rail, thereby selectively biasing the circuit pack into the shelf assembly housing. The shelf assembly housing includes a backplane including a connector configured to selectively engage a connector of the circuit pack. The support rail includes a recess configured to selectively engage a rail of the circuit pack. The latch rail member includes a substantially planar portion and a retention post. The retention post of the latch rail member is disposed through one or more holes formed through the support rail, thereby movably coupling the latch rail member to the support rail. The latch rail member also includes one or more guide pins. The one or more guide pins of the latch rail member are disposed through one or more holes formed through the support rail, thereby preventing rotation of the latch rail member with respect to the support rail. The spring mechanism includes a linear spring disposed about the retention post of the latch rail member on a side of the support rail opposite the latch rail member. The linear spring is secured to the retention post using a washer and a nut. The spring mechanism is pre-loaded in excess of a predetermined connector insertion force associated with the electronic shelf assembly and the circuit pack.

In another exemplary embodiment, the present disclosure provides a latch rail assembly configured to be coupled to an electronic shelf assembly and selectively receive a circuit pack including a pivotable handle incorporating a retention hook, the latch rail assembly including: a support rail configured to be coupled to the electronic shelf assembly; a latch rail member movably coupled to the support rail and defining a recess configured to selectively receive and retain the retention hook of the pivotable handle of the circuit pack; and a spring mechanism coupled to the latch rail member and the support rail, wherein the spring mechanism allows for relative movement of the latch rail member with respect to the support rail while biasing the latch rail member towards the support rail. The support rail includes a recess configured to selectively engage a rail of the circuit pack. The latch rail member includes a substantially planar portion and a retention post. The retention post of the latch rail member is disposed through one or more holes formed through the support rail, thereby movably coupling the latch rail member to the support rail. The latch rail member also includes one or more guide pins. The one or more guide pins of the latch rail member are disposed through one or more holes formed through the support rail, thereby preventing rotation of the latch rail member with respect to the support rail. The spring mechanism includes a linear spring disposed about the retention post of the latch rail member on a side of the support rail opposite the latch rail member. The linear spring is secured to the retention post using a washer and a nut. The spring mechanism is pre-loaded in excess of a predetermined connector insertion force associated with the electronic shelf assembly and the circuit pack.

In a further exemplary embodiment, the present disclosure provides a latch rail assembly configured to be coupled to an electronic shelf assembly and selectively receive a circuit pack including a pivotable handle incorporating a retention hook, the latch rail assembly including: a support rail; a latch rail member movably coupled to the support rail and defining a recess; and a spring mechanism coupled to the latch rail member and the support rail, wherein the spring mechanism allows for relative movement of the latch rail member with respect to the support rail while biasing the latch rail member towards the support rail. The latch rail assembly also includes a plurality of additional latch rail members and spring mechanisms coupled to the support rail along a length thereof.

BRIEF DESCRIPTION OF THE DRAWINGS

The present disclosure is illustrated and described herein with reference to the various drawings, in which like reference numbers are used to denote like assembly components, as appropriate, and in which:

FIG. 3 is a planar view illustrating one exemplary embodiment of the spring loaded circuit pack latch rail member of the present invention;

DETAILED DESCRIPTION OF THE DISCLOSURE

Again, in various exemplary embodiments, the present disclosure provides an electronic shelf assembly that incorporates spring loaded circuit pack latch rails. The spring mechanism utilized with each latch rail is pre-loaded in excess of the given connector insertion force and the connector will "bottom out" before the spring mechanism is compressed further. Once the connector is "bottomed out," the latch force will exceed the pre-load on the spring mechanism, and the latch rail will move or deflect. This movement or deflection of the latch rail absorbs the manufacturing and assembly tolerances associated with the electronic shelf assembly, circuit pack, and latches, while properly securing the circuit pack in the electronics shelf assembly. In this manner, excess forces on the connectors are avoided.

Figure 1:
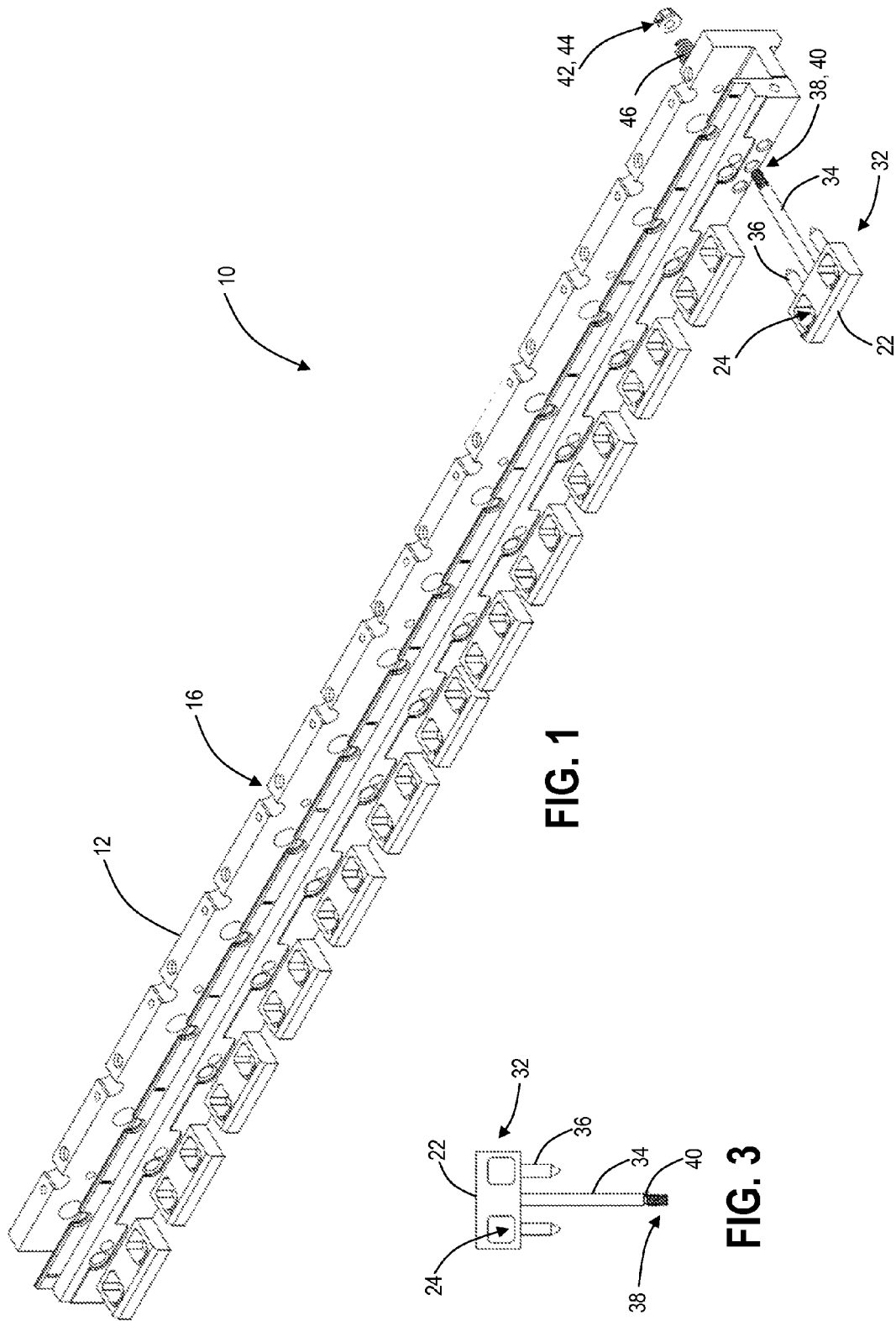
FIG. 1 is a partially exploded perspective view illustrating one exemplary embodiment of the spring loaded circuit pack latch rail assembly of the present invention.
Figure 2:
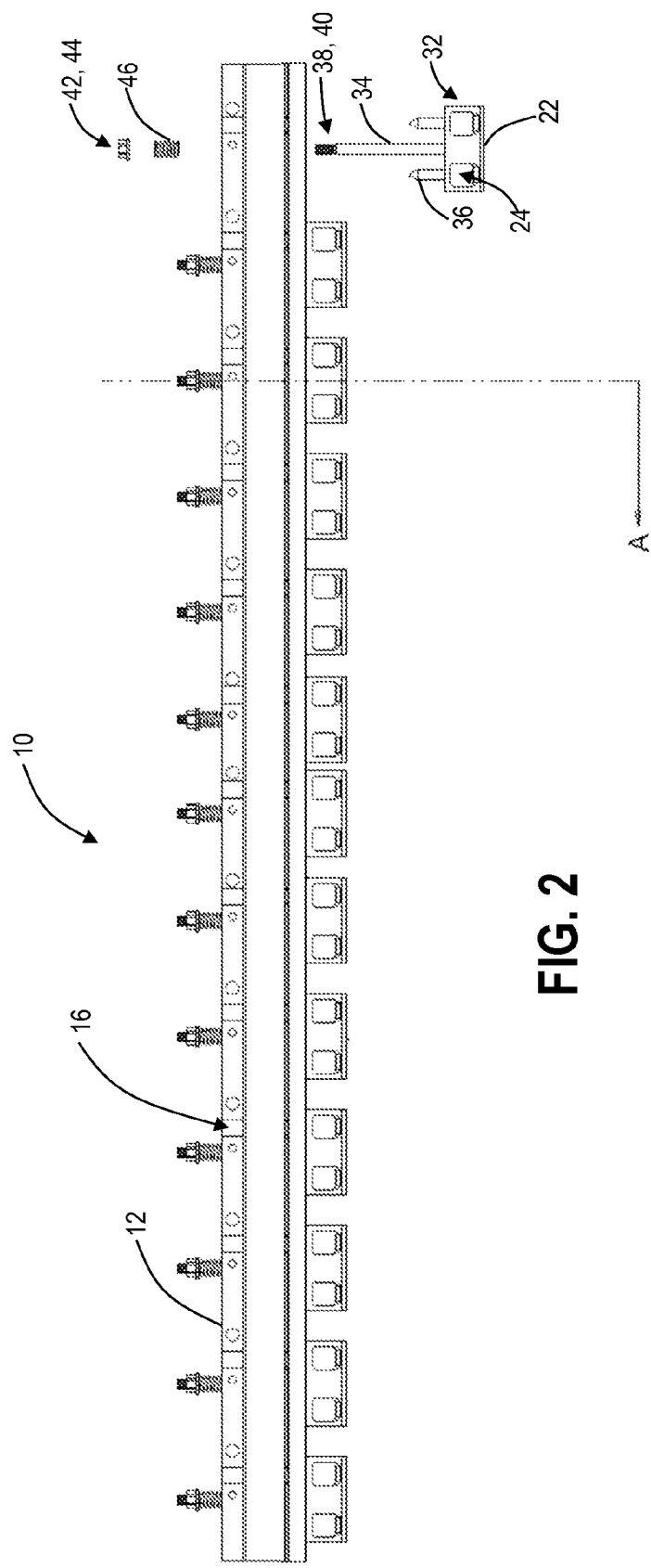
FIG. 2 is a partially exploded planar view illustrating one exemplary embodiment of the spring loaded circuit pack latch rail assembly of the present invention.
Figure 5:
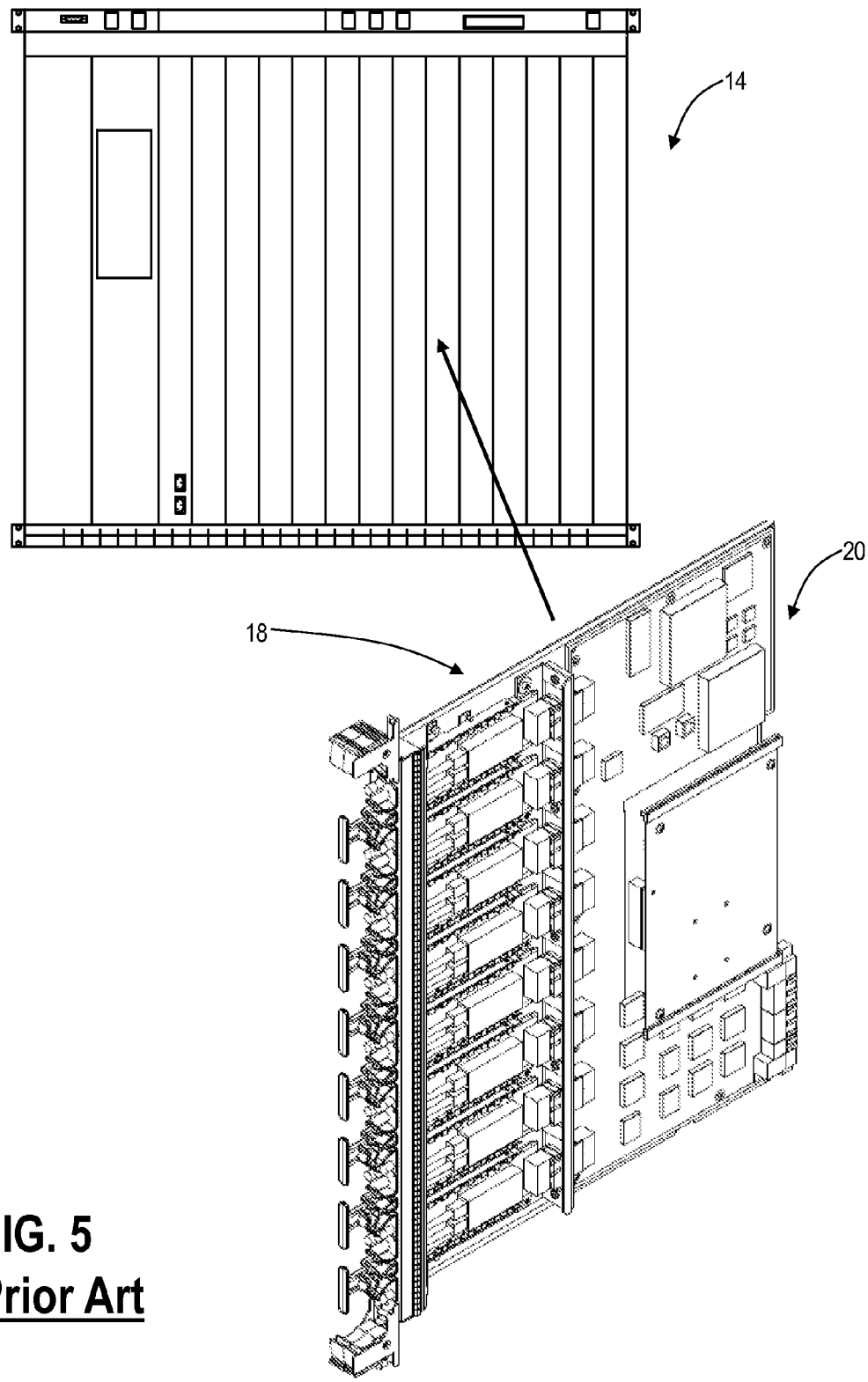
FIG. 5 is a planar and perspective view illustrating exemplary embodiments of an electronic shelf assembly and an electronic circuit pack, respectively, used in conjunction with the spring loaded circuit pack latch rail assembly of the present invention.

Referring now specifically to FIGS. 1 and 2, in one exemplary embodiment, the latch rail assembly 10 of the present invention includes a support rail 12 that is rigidly mounted to a conventional shelf assembly housing 14 (FIG. 5) using screws, rivets, pins, and/or the like. Such shelf assembly housings 14 are well known to those of ordinary skill in the art. The support rail 12 includes a plurality of slots or recesses 16, each configured to receive a rail 18 (FIG. 5) associated with a corresponding circuit pack 20 when the circuit pack 20 is disposed within the shelf assembly housing 14, by, for example, sliding the circuit pack 20 into the shelf assembly housing 14. Accordingly, the latch rail assembly 10 can be utilized above and/or below, or on either side of, the circuit pack(s) 20, as the configuration of the shelf assembly housing 14 dictates. As alluded to above, one or more connectors disposed on the back portion of each circuit pack 20 engage one or more connectors associated with the backplane of the shelf assembly housing 14 when the circuit pack(s) 20 are disposed within the shelf assembly housing 14, thereby completing the desired electrical connections.

Figure 6:
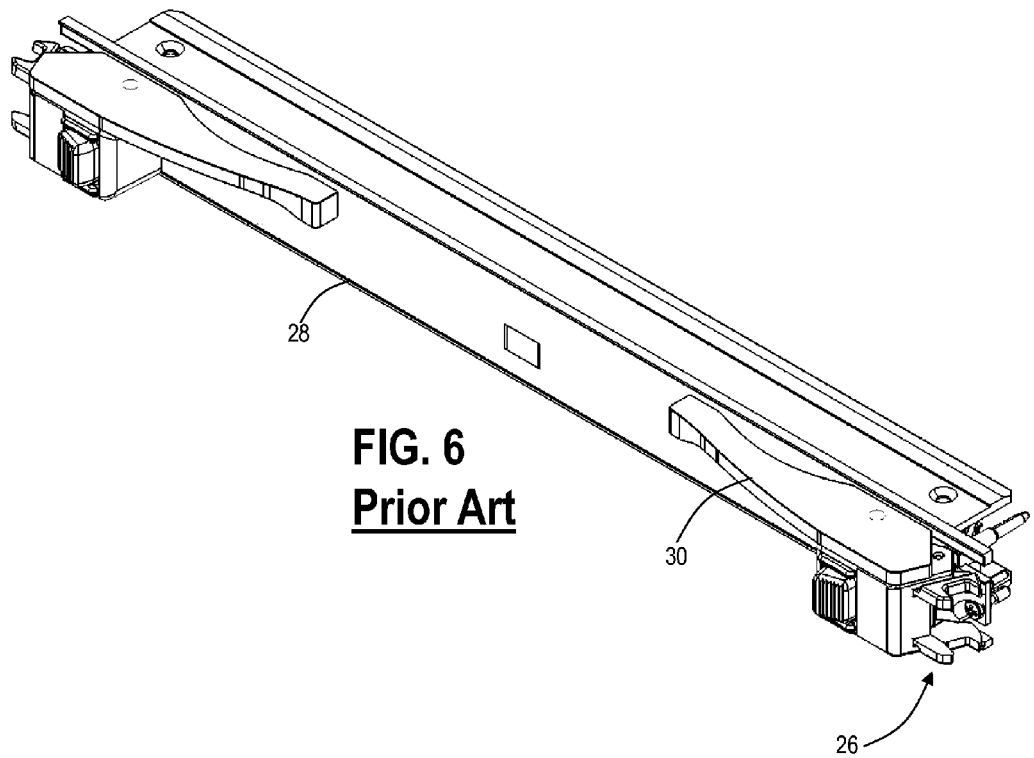
FIG. 6 is a perspective view illustrating one exemplary embodiment of an electronic circuit pack latch assembly used in conjunction with the spring loaded circuit pack latch rail assembly of the present invention.
Figure 7:
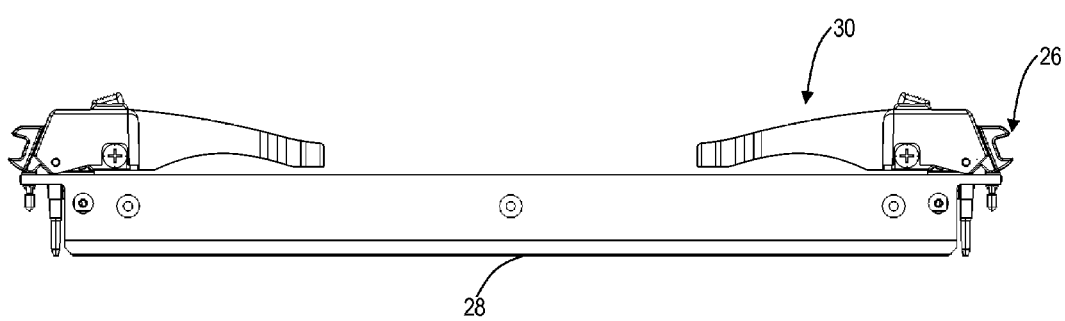
FIG. 7 is a planar view illustrating one exemplary embodiment of an electronic circuit pack latch assembly used in conjunction with the spring loaded circuit pack latch rail assembly of the present invention.

A plurality of latch rail members 22 are movably coupled to the support rail 12. Each of the plurality of latch rail members 22 includes one or more recesses or slots 24, or the like, that is/are configured to receive and retain one or more hooks or protrusions 26 (FIGS. 6 and 7), or the like, associated with the corresponding circuit pack 20 when the circuit pack 20 is disposed within the shelf assembly housing 14 and secured. In general, such recesses or slots 24 and hooks or protrusions 26 are well known to those of ordinary skill in the art as a means for securing a circuit pack 20 within a shelf assembly housing 14. Specifically, each circuit pack 20 includes a faceplate 28 (FIGS. 6 and 7) including a pivotable handle 30 (FIGS. 6 and 7) at each end. When these pivotable handles 30 are actuated, the associated hook(s) or protrusion(s) 26 are deployed into the recess(es) or slot(s) 24 of the corresponding latch rail member 22, and the circuit pack 20 is biased into and secured within the shelf assembly housing 14, thereby ensuring the proper electrical connection between the circuit pack 20 and the backplane. Advantageously, this electrical connection is not disrupted by vibrations or the like that the shelf assembly housing 14 is often subjected to.

It should be noted that, although a plurality of latch rail members 22 are coupled to each support rail 12 in this exemplary embodiment, with each latch rail member 22 including a pair of recesses 24 for receiving a pair of hooks 26, it will be readily apparent to those of ordinary skill in the art that a single latch rail member 22 including a plurality of recesses 24 could be used to retain and secure a plurality of circuit packs 20 utilizing any number of hooks 26. One advantage to utilizing a plurality of latch rail members 22 coupled to each support rail 12 is that the force applied to each connector can be individualized, ensuring that each connector is appropriately "bottomed out." It should also be noted that this latch rail assembly configuration can be utilized at one or both ends of each circuit pack 20. Typically, the components of the latch rail assembly 10 are manufactured from a metal, a hardened plastic, or another similarly rigid material.

Referring now specifically to FIGS. 1-3, each latch rail member 22 includes a substantially planar portion 32 in which the recesses or slots 24 are formed. A retention post 34 is coupled to this substantially planar portion 32. When the latch rail member 22 is coupled to the support rail 12, this retention post 34 passes through one or more holes manufactured into the support rail 12. One or more guide pins 36 are also coupled to the substantially planar portion 32 and engage one or more holes manufactured into the support rail, thereby preventing rotation of the substantially planar portion 32 with respect to the support rail 12. It will be readily apparent to those of ordinary skill in the art that various components of the latch rail member 22 can be integrally formed. The end of the retention post 34 that passes through the support rail 12 includes threads 38 and a washer stop 40 for receiving a washer 42 and a nut 44. When fully assembled, the washer stop 40 is disposed a predetermined distance from the corresponding surface of the support rail 12, such that a gap is formed for the placement of a spring 46 (FIGS. 1 and 2).

The spring gap and spring 46, which may be a linear compression spring, a bushing, or the like, are selected such that the spring mechanism utilized with each latch rail member 22 is pre-loaded in excess of the given connector insertion force and the connector will "bottom out" before the spring mechanism is compressed further. Once the connector is "bottomed out," the latch force will exceed the pre-load on the spring mechanism, and the latch rail member will move or deflect. This movement or deflection of the latch rail member 22 absorbs the manufacturing and assembly tolerances associated with the shelf assembly housing 14 (FIG. 5), circuit pack 20 (FIG. 5), and pivotable handle 30 (FIGS. 6 and 7), while properly securing the circuit pack 20 in the shelf assembly housing 14. In this manner, excess forces on the connectors are avoided. It will be readily apparent to those of ordinary skill in the art that the location and type of spring or bushing can be varied, provided that the spring or bushing biases the latch rail member 22 in its original position prior to a sufficient force being exerted upon it by the corresponding circuit pack 20, at which point the latch rail member 22 will move or deflect predictably. A linear compression spring is preferred in this capacity due to its very predictable characteristics.

Figure 4:
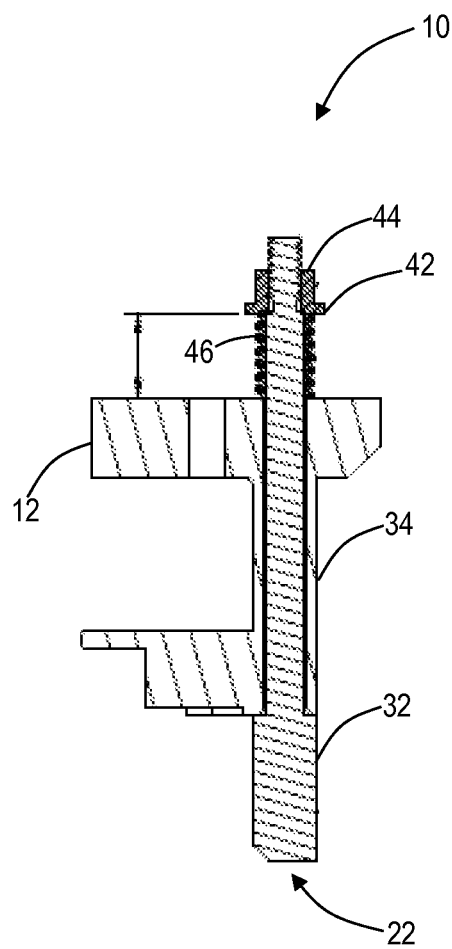
FIG. 4 is a partial cross-sectional view illustrating one exemplary embodiment of the spring loaded circuit pack latch rail assembly of the present invention.

FIG. 4 more clearly illustrates the configuration of the latch rail assembly 10 of the present invention. Specifically, the substantially planar portion 32 of the latch rail member 22 is coupled to the retention post 34, which passes through the support rail 12. The washer 42 and nut 44 engage the threads 38 and washer stop 40 of the retention post 34 on the back side of the support rail 12, opposite the substantially planar portion 32 of the latch rail member 22. When fully engaged, the washer 42 and back surface of the support rail 12 define the spring gap, or pre-load gap, in which the linear compression spring 46 is disposed. Again, the spring 46 is not compressed beyond the pre-load, and the substantially planar portion 32 of the latch rail member 22 does not move or deflect, until the associated connector is "bottomed out" and the latch force exerted on the substantially planar portion 32 of the latch rail member 22 exceeds the pre-load of the spring 26. By way of example only, this latch force may be about 100 lbs. and the substantially planar portion 32 of the latch rail member may move or deflect by about 0.1 in., although such specifications are dependent upon the application.

In general, it can be appreciated that the moving or deflecting latch rail member 22 holds the corresponding circuit pack 20 and its connector(s) securely against the backplane of the shelf assembly housing 14, while accommodating the associated manufacturing and assembly tolerances. The moving or deflecting latch rail member 22 does not exert extreme forces on these components due to the careful selection of the associated spring 46. In this manner, the issues presented by conventional electronic shelf assemblies are addressed, especially as they relate to high-speed optical networking systems and the like.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims, without limitation.

What is claimed is:

1. An electronic shelf assembly configured to selectively receive a circuit pack including a faceplate with a pivotable handle incorporating a retention hook, the electronic shelf assembly comprising:
   a shelf assembly housing configured to selectively receive the circuit pack;
   a support rail coupled to a front portion of the shelf assembly housing;
   a latch rail member movably coupled to a front surface of the support rail protruding outwards from the front portion of the shelf assembly housing and defining a recess configured to selectively receive and retain the retention hook of the pivotable handle of the faceplate of the circuit pack, thereby selectively securing the circuit pack within the shelf assembly housing; and
   a spring mechanism coupled to the latch rail member and the support rail, wherein the spring mechanism allows for relative movement of the latch rail member with respect to the support rail while biasing the latch rail member towards the support rail, thereby selectively biasing the circuit pack into the shelf assembly housing.

2. The electronic shelf assembly of claim 1, wherein the shelf assembly housing comprises a backplane including a connector configured to selectively engage a connector of the circuit pack.

3. The electronic shelf assembly of claim 1, wherein the support rail comprises a recess configured to selectively engage a rail of the circuit pack.

4. The electronic shelf assembly of claim 1, wherein the latch rail member comprises a substantially planar portion and a retention post.

5. The electronic shelf assembly of claim 4, wherein the retention post of the latch rail member is disposed through one or more holes formed through the support rail, thereby movably coupling the latch rail member to the support rail.

6. The electronic shelf assembly of claim 1, wherein the latch rail member comprises one or more guide pins.

7. The electronic shelf assembly of claim 6, wherein the one or more guide pins of the latch rail member are disposed through one or more holes formed through the support rail, thereby preventing rotation of the latch rail member with respect to the support rail.

8. The electronic shelf assembly of claim 1, wherein the spring mechanism comprises a linear spring.

9. The electronic shelf assembly of claim 4, wherein the spring mechanism comprises a linear spring disposed about the retention post of the latch rail member on a side of the support rail opposite the latch rail member.

10. The electronic shelf assembly of claim 9, wherein the linear spring is secured to the retention post using a washer and a nut.

11. A method for providing an electronic shelf assembly configured to selectively receive a circuit pack including a faceplate with a pivotable handle incorporating a retention hook, the method comprising:

providing a shelf assembly housing configured to selectively receive the circuit pack;

providing a support rail coupled to a front portion of the shelf assembly housing;

providing a latch rail member movably coupled to a front surface of the support rail protruding outwards from the front portion of the shelf assembly housing and defining a recess configured to selectively receive and retain the retention hook of the pivotable handle of the faceplate of the circuit pack, thereby selectively securing the circuit pack within the shelf assembly housing; and providing a spring mechanism coupled to the latch rail member and the support rail, wherein the spring mechanism allows for relative movement of the latch rail member with respect to the support rail while biasing the latch rail member towards the support rail, thereby selectively biasing the circuit pack into the shelf assembly housing.

12. The method of claim 11, wherein the shelf assembly housing comprises a backplane including a connector configured to selectively engage a connector of the circuit pack.

13. The method of claim 11, wherein the support rail comprises a recess configured to selectively engage a rail of the circuit pack.

14. The method of claim 11, wherein the latch rail member comprises a substantially planar portion and a retention post.

15. The method of claim 14, wherein the retention post of the latch rail member is disposed through one or more holes formed through the support rail, thereby movably coupling the latch rail member to the support rail.

16. The method of claim 11, wherein the latch rail member comprises one or more guide pins.

17. The method of claim 16, wherein the one or more guide pins of the latch rail member are disposed through one or more holes formed through the support rail, thereby preventing rotation of the latch rail member with respect to the support rail.

18. The method of claim 11, wherein the spring mechanism comprises a linear spring.

19. The method of claim 14, wherein the spring mechanism comprises a linear spring disposed about the retention post of the latch rail member on a side of the support rail opposite the latch rail member.

20. The method of claim 19, wherein the linear spring is secured to the retention post using a washer and a nut.

* * * * *